US005629860A

United States Patent [19]
Jones et al.

[11] Patent Number: 5,629,860
[45] Date of Patent: May 13, 1997

[54] METHOD FOR DETERMINING TIMING DELAYS ASSOCIATED WITH PLACEMENT AND ROUTING OF AN INTEGRATED CIRCUIT

[75] Inventors: Thomas R. Jones, Scottsdale; Steven L. Crain, Chandler, both of Ariz.; Joseph J. Burkis, Hilton, N.Y.

[73] Assignee: Motorola, Inc., Schaumburg, Ill.

[21] Appl. No.: 242,984

[22] Filed: May 16, 1994

[51] Int. Cl.$^6$ .................................................. G11C 7/02
[52] U.S. Cl. ............................................................. 364/490
[58] Field of Search ............................ 364/488, 490, 364/489, 491

[56] References Cited

U.S. PATENT DOCUMENTS

| | | | |
|---|---|---|---|
| 4,922,432 | 5/1990 | Kobayashi et al. | 364/488 |
| 4,967,367 | 10/1990 | Piednoir | 364/490 |
| 4,978,664 | 12/1990 | Bell | 364/488 |
| 5,084,824 | 1/1992 | Lam et al. | 364/489 |
| 5,111,413 | 5/1992 | Lazansky et al. | 364/490 |
| 5,175,693 | 12/1992 | Kurosawa et al. | 364/491 |
| 5,278,769 | 1/1994 | Bair et al. | 364/491 |
| 5,452,224 | 9/1995 | Smith, Jr. et al. | 364/488 |

*Primary Examiner*—Kevin J. Teska
*Assistant Examiner*—Dan Fiul
*Attorney, Agent, or Firm*—Rennie William Dover; Bradley J. Botsch, Sr.

[57] ABSTRACT

The present invention provides a method for determining timing delays associated with the placement and routing delays of an integrated circuit. In particular, the present invention determines the area of each region wherein a region includes a group or subgroup of circuit elements for use in designing an integrated circuit. Once the area for each region is obtained, substantially more accurate and more design specific wireload model and net parasitics can be obtained. The wireload models or net parasitics can then be supplied to other CAE tools to create a modified netlist. Moreover, the present invention provides a process which allows the user to account for the RC time constant effects of wire delay on a hierarchical block basis thereby improving the accuracy of the wire placement and routing delay estimate while preserving the performance benefits of a traditional simplified equation.

12 Claims, 2 Drawing Sheets

METHOD FOR DETERMINING TIMING DELAYS ASSOCIATED WITH PLACEMENT AND ROUTING OF AN INTEGRATED CIRCUIT

FIELD OF THE INVENTION

This invention relates to a method for designing an integrated circuit and, in particular, to a method for determining timing delay parasitics associated with the placement and routing of the integrated circuit.

BACKGROUND OF THE INVENTION

When designing an integrated circuit, an automated process may be utilized. Typically, a floor planner is utilized to lay out an integrated circuit wherein a floor planner is a tool for automatically placing logic components, memory components and other circuit elements on the integrated circuit as is well known. The results obtained from the floor planning tool may then be utilized by a logic synthesizer to better predict the functionality and performance of the integrated circuit design.

However, at least one problem with such a design of integrated circuits is that data available to a logic synthesizer for estimating timing delays within the integrated circuit are design general and not design specific. For example, look-up tables are typically used to estimate various timing delays wherein such look up tables are generated from average effects experienced across an entire integrated circuit (IC) family. However, an entire IC family may range in size from a few thousand gates to hundreds of thousands of gates. As a result, the look up tables are very general and assumptions about linearity, variability, accuracy, and granularity adversely affect the specific design results in most cases.

Hence, there is a need for a method and tool that can provide more accurate timing delay information that relates specifically to design conditions of the target integrated circuit. Moreover, it would be advantageous to incorporate this tool into a floor planning tool thereby providing a method of correlating the floor planning and synthesis results with respect to placement and routing delays within the integrated circuit.

DETAILED DESCRIPTION OF THE DRAWINGS

Figure 1:
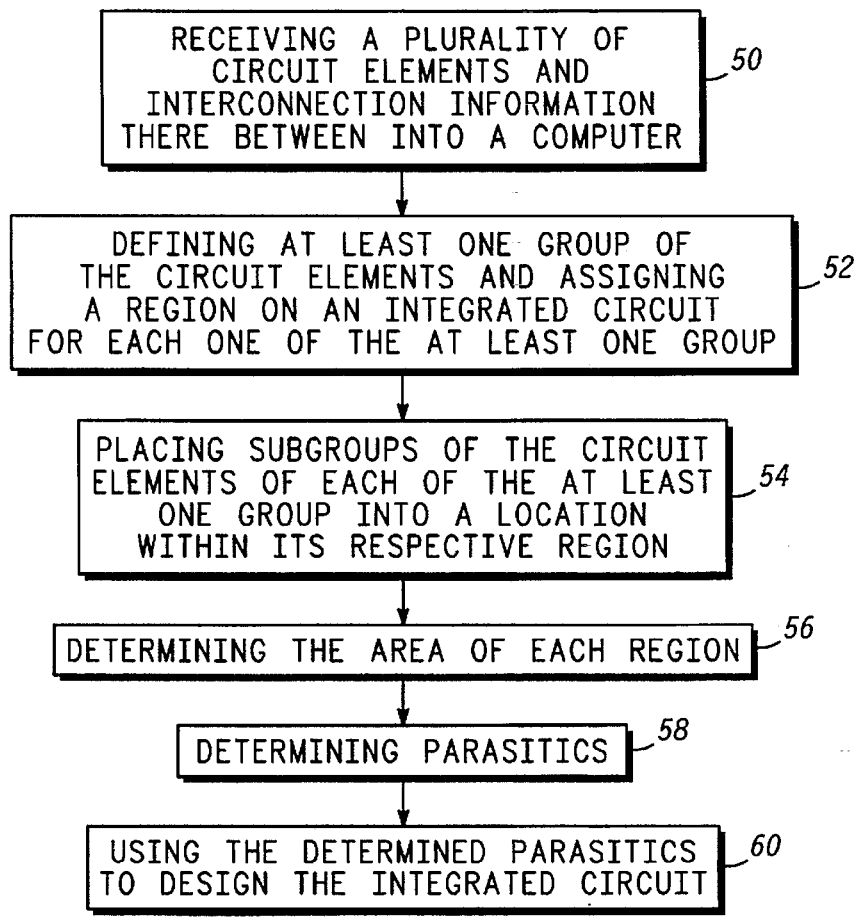
FIG. 1 is a flow chart illustrating a method for determining timing delays associated with the placement and routing of an integrated circuit in accordance with the present invention.

Referring to FIG. 1, a flow chart illustrating a method for determining parasitics associated with the placement and routing of an integrated circuit is shown. The first step, as represented by box 50, involves receiving a plurality of circuit elements and interconnection information between each of the circuit elements. This is essentially a net list which includes the structure of an entire integrated circuit as well as the interconnection between each circuit element as desired by a user.

The next step, as represented by box 52, is to define at least one group of the circuit elements and assign a region on an integrated circuit for each one of the at least one group. For example, one group of circuit elements may be output buffers and that group of circuit elements may be assigned to a region located in the periphery of the integrated circuit.

The next step, as represented by box 54, is to place the circuit elements of each of the at least one group into a location within its respective region wherein it is understood that one may place single circuit elements or subgroups thereof into the at least one group.

The next step, as represented by box 56, is to determine the area of each region. The area determination is a function of the placement, location, shape, utilization and size of the region within the integrated circuit wherein the determination of the area will be explained in more detail hereinafter. It is important to note that given the area of the region, the average wire length per fanout can then be estimated by using theoretical calculations, which are design specific, in combination with statistical results wherein statistical results are derived from an empirical database. This significantly increases the accuracy of the area estimate, and the resulting wire length estimations, and makes the result design specific.

The next step, as represented by box 58, is to determine parasitics associated with delay within the integrated circuit. The parasitics determined may be either (i) wireload models which consider both the area of the region and the fanout of the net, or (ii) net parasitics which additionally take into account the effects of wire routing, that is, the effects of capacitance of the routing wire within the integrated circuit. It is important to note that the present invention determines these parasitics based upon estimates of the actual area of the region thereby making its estimates more design specific.

The last step, as represented by box 60, is to use the determined parasitic values to design the integrated circuit having enhanced performance. That is, the parasitic values, along with the netlist, are supplied to a logic synthesizer to analyze the performance of the IC and optimize the design using the parasitics as timing constraints. Since accurate timing delay information is supplied to the logic synthesizer, a more accurate estimation of its performance can be obtained which further provides a more optimal design solution. Hence, the present invention allows for the manufacture of a desired integrated circuit with the assurability that such integrated circuit will perform as expected.

Figure 2:
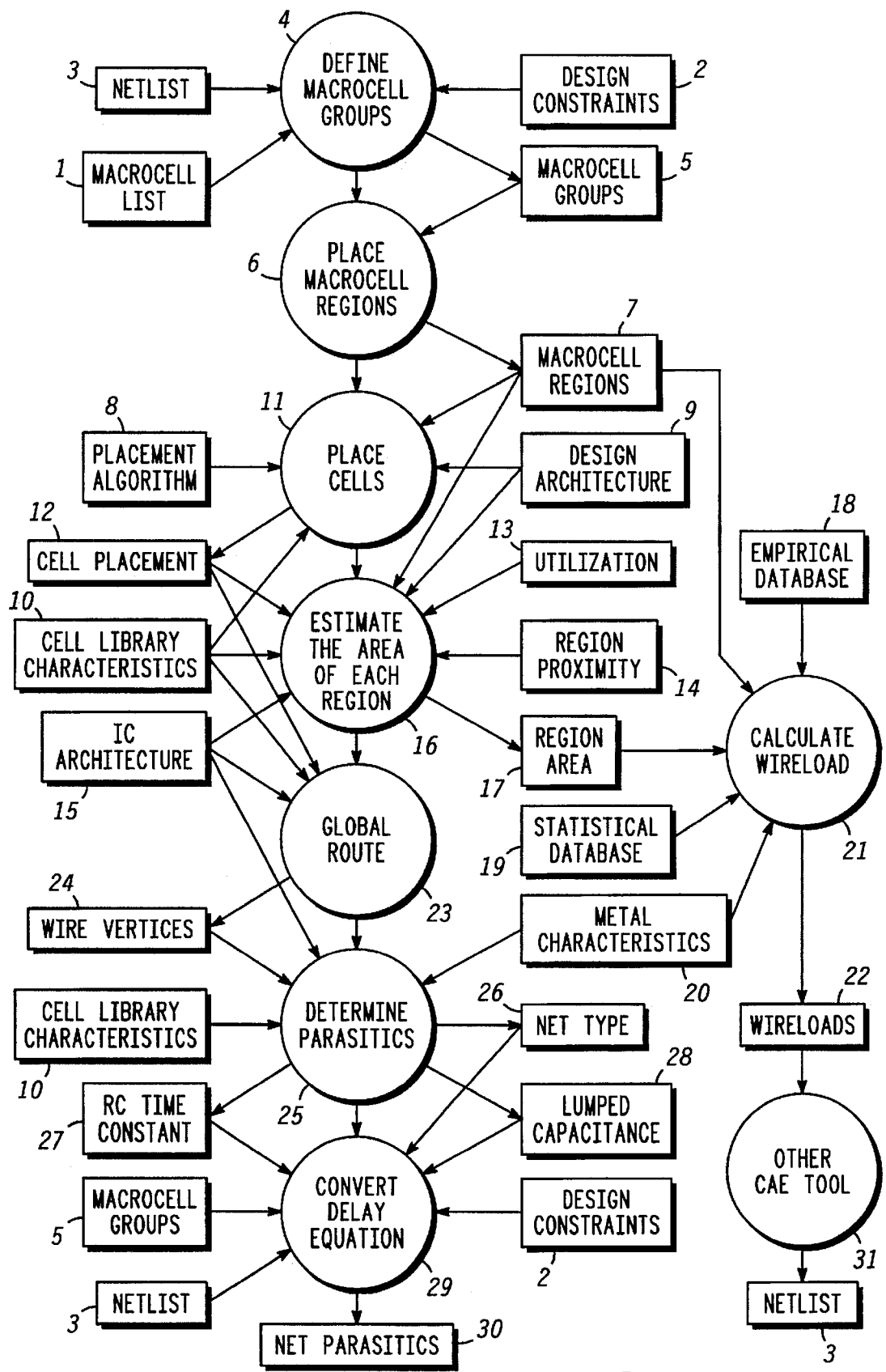
FIG. 2 is a more detailed flow chart illustrating a method for determining timing delays associated with the placement and routing of an integrated circuit in accordance with the present invention.

Referring to FIG. 2, there is illustrated a more detailed flow chart for determining timing delays associated with the placement and routing of an integrated circuit.

The first step in designing an integrated circuit is to define macrocell groups as illustrated by circle 4 wherein boxes 1-3 are typical inputs that are used to define the macrocell groups. The input macrocell list, as represented by box 1, is a list of the predesigned macrocells that are permitted for use in a design of a given macrocell technology. The input net list, as represented by box 3, includes references to macrocells in the macrocell list and instructions/information for interconnection between each port of the macrocells so as to define the logical function of the integrated circuit that is to be designed. The input design constraints, as represented by box 2, includes physical placement instructions for the primary input/output macrocells referenced in the net list as well as any floor planning instructions from previous iterations to the floor plan flow.

An output of define macrocell groups is macrocell groups as represented by box 5. Generally, output macrocell groups is a list of group names and the macrocell occurrences included therein. Output macrocell groups are created by a partitioning algorithm which is either performed manually by the user or automatically by a floor planning tool (or some combination of the two) which defines groups of macrocells that belong in the same proximity to provide an optimal placement solution.

The next step, as represented by box 6, is to place macrocell regions. An input to this step is output macrocell groups (5) while the output provided by place macrocell regions (6) is macrocell regions as represented by box 7. Macrocell regions are the geometric bounding boxes around each group of macrocells in the macrocell groups and have height, width and origin coordinates relative to the integrated circuit origin. A floor planner uses the regions to define constraints for placement of macrocells and routing of nets for macrocells in each group.

Once we have placed the macrocell regions, the next step is to place cells/circuit elements as represented by box 11. The inputs to box 11 are macrocell regions 7, placement algorithm 8, design architecture 9 and cell library characteristics 10. Moreover, the output of place cells 11 is cell placement block 12. The placement algorithm specifies the location of each circuit element included in the macrocell groups constrained by the bounding box defined by the macrocell regions 7. In other words, each circuit element is placed within its respective macrocell region. Moreover, design architecture 9 defines constraints to the placement algorithm 8 due to the logical structure of the integrated circuit being designed. These constraints account for the impact due to various architectures such as random logic, registers, data paths, busses, clock trees, test scan paths and average fan out of nets, as well as large macrocells such as RAMS. The cell library characteristic 10 defines additional constraints to the placement algorithm due to physical properties of the macrocells such as accessibility of ports, metal blockages, power bus location, area, and aspect ratio.

The placement algorithms of the present invention may be manual, random, advanced linear, and advanced quadratic. Manual placement is performed by the user manually and is beyond the control of a floor planning tool. Random placement is a minimal effort algorithm and accounts for the constraints defined by the cell library characteristics. The advanced algorithms are more rigorous algorithms and expend effort to converge upon an optimal placement solution. Both of the advanced algorithms account for all of the constraints defined by the cell library characteristics and design architecture wherein the advanced linear algorithm is a slightly more complex algorithm than the advanced quadratic algorithm. Output cell placement 12 is a list of coordinates defining the location of each macrocell instance within its respective macrocell group within its respective macrocell region.

Thus far what has been described is a method for individually placing each cell for each macrocell group within its respective macrocell region wherein cell placement 12 is an output that includes a list of coordinates that define and store the location of each cell for each macrocell group within its respective macrocell region.

Following the step of place cells (11) is the step calculate area of each region as represented by circle 16. The inputs to circle 16 are macrocell regions (7), placement algorithm (8), design architecture (9), cell library characteristics (10), cell placement (12), utilization (13), region proximity (14), and IC (integrated circuit) architecture (15), while the output is region area as represented by box 17. The macrocell regions (7) define the location, RL, and shape, RS, of the region. The placement algorithm (8), the design architecture (9), cell library characteristics (10), and cell placement (12) define the efficiency of the placement. The region proximity (14) defines constraints due to the probable congestion of the region due to physical location on the IC and relative location of connected regions. The IC architecture (15) defines the routing characteristics of the IC such as routing levels, power grid configuration, available routing resources, master slice configuration and macrocell placement site plan. The utilization (13) defines the ratio of macrocell area to metal routing area given the congestion, IC routing characteristics, region location, region aspect ratio, and placement efficiency.

The step 16 estimates the area for each macrocell region that exists in the floorplanning environment. The designer typically defines the region to correspond to some logical partition of the design hierarchy. The designer chooses a placement technique, P, which is represented by one of three previously discussed techniques: random, manual or advanced. The designer specifies the shape of the region, RS, and the location of the region, RL.

Given the netlist for the design partition, the floorplanner can determine the size, S, of each region. The floorplanner performs a routability prediction based in part on empirical data as a function of S and the target integrated circuit. The utilization estimate for that region, U, is initially determined by IC routing characteristics. The choice of P can produce a wide range of results and is used to modify the utilization U based on the likelihood of that placement technique resulting in an optimal placement solution. U is also modified to account for the impact of the preferred routing direction on RS. U is further modified to account for routing congestion caused by RL within the integrated circuit.

Figure 3:
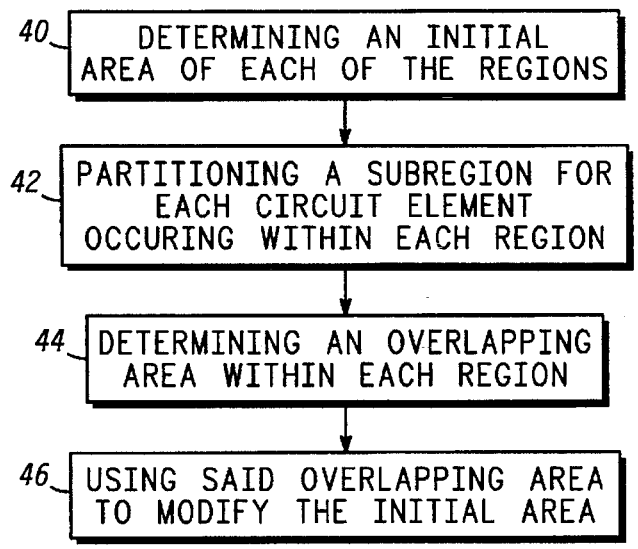
FIG. 3 is a detailed flow chart illustrating in more detail the step of estimating the area of each region of FIG. 2.

Referring to FIG. 3, a more detailed flow chart illustrating the step of estimate the area of each region (circle 16 of FIG. 2) is shown. Generally, the area estimation (Area) can be initially represented as a function of the width (w) and length (l) of a defined region divided by the utilization (U) requirements for that area as shown in EQN. 1 and illustrated by box 40 wherein U is a function of empirical data based upon such factors as the size of the integrated circuit and the location of the region within the integrated circuit.

$$\text{Area} = (w * l)/U \qquad \text{EQN. 1}$$

The present invention additionally partitions a subregion for each circuit element/cell that has been placed within that region as illustrated by box 42 wherein the size of the subregion is determined based upon routing requirements for each particular cell such as the number of input and output ports for each cell. Then, the present invention determines an overlapping area of each subregion with respect to the other subregions as illustrated by box 44. In particular, the overlapping area within each subregion is determined by both the overlapping width portion and the overlapping length portion of each subregion. This overlapping area is used to modify the initial area of EQN. 1 as illustrated by box 46 thereby obtaining the area expression as shown in EQN. 2.

$$\text{Area} = (w * l)/U - \text{SUM}[(OW_n * OL_n) * (_w n * l_n)/U_n] \qquad \text{EQN. 2}$$

where

SUM[ ] is the mathematical expression denoting that an expression that is a function of n components is summed over n where n ranges from 1 to n;

$OW_n$ is the overlapping width portion of subregion n;

$OL_n$ is the overlapping length portion of subregion n;

$w_n$ is the width of subregion n;
$l_n$ is the width of subregion n; and
$U_n$ is the utilization requirements for subregion n.

Empirical data and the area estimation obtained above are used to derive the average wire lengths per fanout for each region in the design thereby creating a design specific wireload model for each region. This information is written in a format that can then be back annotated to a logic synthesizer to be used for each logical block in the design instead of typical default wire load models. As a result, these design specific wireload models provide a significant increase in accuracy.

Thus far, the present invention has provided a method whereby through the use of a floor planning tool, a design for an integrated circuit can be partitioned into a plurality of region wherein each region includes cells that comprise the design of the IC. Moreover, the present invention then determines the area of each region. Given the area of the region, the average wire length per fanout can then be estimated by using theoretical calculations in combination with statistical results derived from an empirical database. This method will significantly increase the accuracy of the area estimate, and the resulting wire length estimations, and make the result design specific.

Following the step of calculate area of the region (16), one of two paths may be taken. A first path is to calculate wireload as represented by circle 21. The inputs to circle 21 are region area (17), empirical database (18), statistical database (19) and metal characteristics (20), while the output of circle 21 is wireloads as represented by box 22. This path results in an intermediate estimate of the capacitance of routing wire taking into account the area of the region and the fanout of the net wherein the effects of routing algorithms are not included. This estimation of the capacitance of routing wire ($C_L$) is known as an area based wireload model and is based on the function described in EQN. 3.

$$C_L = F(A, F, C0, L) \qquad \text{EQN. 3}$$

where

A=area of the region;
F=fanout of net;
C0=capacitance per unit length; and
L=metal length.

The region area (17), A, defines constraints as to the maximum wire length based on the Steiner tree routing method. The metal characteristics (20) define the capacitance per unit length and resistance per unit square of the metal used for routing the IC.

The empirical database (18) contains average wire length and average wire length variability data as a function of area, and has been derived from collecting data on many actual IC designs. This data is curve fit to an empirically derived formula known as Rent's rule. The coefficients for the Rent's equation are determined from the empirical database (18). The statistical database (19) is derived by creating tables of data from the combination of the empirical database (18) and data extrapolated from Rent's equation. The extrapolated data using the Rent's equation is needed to fill gaps where measured empirical data may not have been available in collecting data for the empirical database (18). From these inputs, the average wire length per net fanout can be calculated as a function of area. The resulting output wireloads (22) is the resistance per unit area, the capacitance per unit area, and a list of average wire lengths for the given regions as a function of net fanout.

Thus, the present invention provides a method to significantly increase the accuracy of wire length estimates as a function of the area of the actual region allocated to groups of macrocells in the design by utilizing the results of a more accurate determination of area of region in combination with the application of the empirical database (18) and statistical database (19). This method is superior in that it provides real time wireload estimates for each region in the design that are specific to the actual IC being designed.

A second path from circle 16 is to proceed with the step of global route as represented by circle 23. The inputs are cell library characteristics (10), cell placement (12), and IC architecture (15), while the output is wire vertices as represented by box 24. This second path eventually leads to output net parasitics as represented by box 30, which is more accurate than the output wireloads (22) provided by the first path wherein this second path takes into account the effects of wire routing and the capacitance of the routing wire. The cell library characteristics (10) define macrocell constraints for location of ports and metal blockages. The cell placement (12) defines constraints for the size of the region, site plan, and available routing tracks. The IC architecture (15) defines constraints for the routing levels, routing pitch and power grid. Global route (23) accounts for these constraints and employs an L-shaped rectilinear Steiner routing algorithm, which is a simplified routing algorithm that attempts to gain 90% of the wire length and vertex information without concern for avoiding routing obstructions. The wire vertices (24) are the net segments and vertices for each routed net in the design.

Following the step of global route (23) is the step determine parasitics as represented by circle 25. The inputs to circle 25 are IC architecture (15), wire vertices (24) and metal characteristics (20), while the outputs are net type (26), resistance-capacitive (RC) time constant (27) and lumped capacitance (28). The IC architecture (15) defines which routing metal layer to use as a function of routing direction, for example, metal layers 1 and 3 may be vertical while metal layer 2 may be horizontal. The wire vertices (24) define the individual net segments and vertices that comprise a net in the design. The metal characteristics (20) define the capacitance per unit length and resistance per square of the metal used for routing the IC.

The net type (26) is determined by examining the ports that the net connects with respect to region boundaries. A net that has all of its macrocell port connections included within a single region is said to be an "internal" net with respect to that region and thus the routing is said to be intra regional. On the other hand, a net that has one or more macrocell port connections that span multiple regions is said to be a "boundary" net with respect to those regions that include its connections and thus the routing is said to be inter regional. Moreover, a boundary net is comprised of multiple segments wherein some of the segments will be internal segments, i.e., segments internal to the regions to which it connects macrocell ports. This distinction between internal and boundary nets is important because this invention reports net parasitics (30) with respect to internal nets and segments distinct from boundary nets and segments so that the user may more tightly control the scope of the back annotated parasitic information.

The RC time constant (27) is determined by using the well known Taylor polynomial expansion approximations for wire vertices (24). The lumped capacitance (28) is determined for each net by summing all of the net segment metal lengths in each routing direction multiplied by the capacitance per unit length for the appropriate metal layer plus the via capacitance for each change of direction.

By providing a step that partitions parasitics into those which are contributed by boundary nets and those contributed by internal nets, the present invention provides the user the ability to more tightly control back annotation scopes. This is particularly important to be able to provide timing constraints to the synthesis environment, which is done on a hierarchical block basis, often before the entire design is completely synthesized. The synthesis environment is such that large hierarchical designs are partitioned into smaller, more manageable, logical blocks, often among multiple designers each responsible for synthesizing the functions of their respective blocks. The success of this partitioning scheme relies on knowing the external conditions caused by adjacent blocks in the design hierarchy. Thus, an important aspect of distinguishing between internal and boundary parasitics is its ability to allow an individual designer to back annotate the internal parasitics of his block with just the boundary parasitics of the other blocks, so that the aggregate effects may be modeled in the synthesis environment without having to overload the system with unnecessary details of other blocks. For example, a typical synthesis tool is designed to handle the details of blocks which are no larger than 50,000 equivalent gates, however current technology is such that 1,000,000 gate designs are feasible, and so synthesis tools must be able to abstract the information in some of the blocks while focusing on the details of others. This requires hierarchy wherein typical prior art in physical design handles the design information flat (that is, non-hierarchical), which does not allow meaningful feedback to the synthesis environment in either timeliness, i.e. before the entire IC is designed, or hierarchically.

Following the step calculate parasitics (25) is the step convert delay equation as represented by circle 29. The inputs to circle 29 are design constraints (2), netlist (3), macrocell groups (5), cell library characteristics (10), net type (26), RC time constant (27) and lumped capacitance (28) and the output is net parasitics (30). The design constraints (2), netlist (3), macrocell groups (5) and cell library characteristics (10) all of which have been afore-described. The cell library characteristics (10) additionally define the cell drive strengths. Output net parasitics as represented by box 30 is a list of wire delay estimates sorted by net type (26) and macrocell group (5).

Typically, the total delay due to placement and routing effects ($t_{PR}$) can be represented as shown in EQN. 4 which is referred to as the complex routing delay equation.

$$t_{PR} = t_{CL} + t_{RC} \qquad \text{EQN. 4}$$

where $t_{CL}$ is the delay due to capacitive loads; and $t_{RC}$ is the delay due to RC time constants.

The delay due to capacitive load on the net, $t_{CL}$, can be represented as shown in EQN. 5.

$$t_{CL} = R_0 * C_L \qquad \text{EQN. 5}$$

where $C_L$ is the capacitive load; and $R_0$ is the signal transition resistance.

$R_0$ can be taken to be a constant, commonly referred to as the "K" factor, which results in the total delay due to the capacitive load being represented as $t_{CL} = KC_L$.

The RC time constant, $t_{RC}$, represents the interconnect delay from a driver to a receiver pin in a network, which can be represented as shown in EQN 6.

$$t_{RC} = R_T (\tfrac{1}{2} C_T + C_L) \qquad \text{EQN. 6}$$

where $R_T$ is the total interconnect resistance; and $C_T$ is the total interconnect capacitance.

For more complex nets, EQN. 6 can be expressed in words that "the RC constant at any point is the sum of the resistance from the driver to the point, multiplied by the capacitance at the point, summed over all points from the driver to the point."

Prior art assumes that the RC time constant, $t_{RC}$, is relatively insignificant compared to the delay, $t_{CL}$, due to capacitive load in the amount it contributes to the total routing delay. Therefore the simplified routing delay equation is simply $t_{PR} = t_{CL}$ (this will be referred to as the "simple equation").

Although the simplified routing delay equation may have been sufficient in previous IC technologies, with the performance requirements and dimensions of the current technologies, such a simplified routing delay equation has been shown to be insufficient. For example, in the case of Motorola's H4C technology, typical areas and fanouts are such that $t_{RC}$ effects are significant and are generally of the same order of magnitude as the $t_{CL}$ effects. The $t_{RC}$ effects are also generally of the same order of magnitude as the intrinsic and exceeds it at the higher fanout and larger area cases as well. Thus, the simple equation is only applicable for low fanout in small areas wherein the simple equation is typically in error by approximately 100% at medium to large areas, even at low fanout. Moreover, as fanout increases, the inaccuracies of the simple equation are even more dramatic.

Thus, the present invention realizes that the $t_{RC}$ effects are significant, and at times even greatly exceed the $t_{CL}$ effects. However, due to the iterative nature of typical logic synthesizers and the number of calculations involved in the complex solution, synthesis environments tend to use the simple routing delay equation and thus neglect the $t_{RC}$ effects. However, the present invention is able to compensate for this in the data content that is actually back annotated to the synthesis environment by factoring in the $t_{RC}$ effects for each load of a multiple load interconnect.

The assumption that enables this to occur is that since the synthesis environment uses the simple equation of $t_{CL} = KC_L$, the synthesis environment has the value of the constant K and therefore requires as input only the capacitive load, $C_L$, for back annotation of routing delays. The present invention provides a modified capacitive load ($C_L'$) using the complex solution for $t_{RC}$ (expressed in EQN. 6) wherein $C_L'$ can be expressed as shown in EQN. 7.

$$C_L' = C_L + (t_{RC}/K) \qquad \text{EQN. 7}$$

Moreover, from the simple equation, one can obtain a modified delay due to the capacitive load as shown in EQN. 8.

$$tC_L' = KC_L' = KC_L + t_{RC} = t_{CL} + t_{RC} \qquad \text{EQN. 8}$$

EQN. 8 represents the complex routing delay equation shown in EQN. 4. $C_L'$ is back annotated to the synthesis environment instead of $C_L$. Using $C_L'$ allows the synthesis environment to use the complex solution as if it were the simple equation thereby significantly increasing accuracy without any impact to performance.

In summary, prior art uses a simplified equation which utilizes only a lumped capacitance value for estimating placement and routing delay. The assumptions that make the simplified equation a reasonable approximation have not been found to hold in the case of advanced IC technologies in the one micron and less range, such as Motorola's H4C and M5C gate array technologies. In response thereto, the present invention provides the step convert delay equation (29) which includes the RC time constant effects for determining placement and routing delay along a circuit path. In particular, the present invention factors the RC time constant effect into the simplified equation. This has the effect of significantly improving the accuracy of the wire placement and routing delay estimate while preserving the performance benefits of the simplified equation.

Following either the first or second paths is the step of other CAE (Computer Aided Engineered) tools as represented by circle 31. The inputs to circle 31 are the netlist (3), wireloads (22) and net parasitics (30). In this step, either the wireloads (22) or the net parasitics (30) are supplied to other CAE tools, which may be a "verification" tool, such as used for simulation or timing analysis, or "design" tools, such as those used for synthesis and are back annotated. Verification tools are used to analyze the design and do not transform the design in any way and therefore do not produce a modified netlist. However, they may provide various types of design information such as timing analysis, functional performance and design rule validation. Design tools do transform the design and a new netlist is produced, optimally improved in its ability to meet design constraints over the previous version. This new (modified) netlist may be used as input to the present invention (as input 3), thereby demonstrating the ability of the present invention to support iterative design improvement, which is important in the design of high performance ICs.

By now it should be apparent that the present invention provides a method for determining timing delays associated with the placement and routing delays of an integrated circuit. In particular, the present invention determines the area of each region wherein a region includes a group or subgroup of circuit elements for use in designing an integrated circuit. Once the area for each region is obtained, substantially more accurate and more design specific wire load and net parasitics models can be obtained. The wireload or net parasitics models can then be supplied to other CAE tools to create a modified netlist. In the case of the synthesis environment, this flow is particularly useful in that the wireloads and net parasitics models are relative to logical groups of macrocells and can be used as timing constraints for the synthesis tool in a hierarchical block fashion. As a result, this method gives maximum control of the scope of the back annotation process to the user of this flow, which is a very important consideration in the synthesis process where the tool itself can not perform this type of analysis in a timely fashion on very large designs, but must perform the analysis on smaller hierarchical subsets of the design. Moreover, the present invention provides a process which allows the user to account for the effects of wire delay on a hierarchical block basis, thereby influencing the bottom up construction of the IC design as it occurs, instead of after the entire design has been completed and can be taken to the traditional place and route tool for feedback on wire delay effects.

While the invention has been described in specific embodiments thereof, it is evidence that many alterations, modifications and variations will be apparent to those skilled in the art. Further, it is intended to embrace all such alterations, modifications and variations in the appended claims.

We claim:

1. A design specific method for designing an integrated circuit by estimating parasitics associated with placement and routing of the integrated circuit in a floor planner tool, the method comprising the steps of:

inputting a plurality of circuit elements and interconnection therebetween into a computer;

defining at least one group of circuit elements and assigning a region on an integrated circuit for each one of said at least one group;

placing subgroups of said circuit elements of each of said at least one group into a location within its respective region;

estimating an area of each of said region;

determining parasitics as a function of said estimated area of each of said regions prior to performing an actual place and route step; and using said determined parasitics to design said integrated circuit.

2. The design specific method according to claim 1 wherein said determining parasitics includes:

determining an average wire length per fanout for each said at least one group; and using said determined average wire length to determine a design specific parasitic based upon its respective region.

3. The design specific method according to claim 1 wherein said determining parasitics includes:

routing said interconnection between ports of said circuit elements of each of said regions;

using said routing to determine a design specific parasitic for each interconnection of said circuit elements; and reducing said design specific parasitic to a simplified form for use with CAE tools.

4. The design specific method according to claim 3 wherein said design specific parasitic includes RC time constant effects.

5. The method according to claim 3 wherein said step of routing includes both inter region routing and intra region routing.

6. The design specific method according to claim 1 wherein said step of estimating an area of each of said region includes:

determining an initial area of each of said regions;

partitioning a subregion for each circuit element occurring within each region;

determining an overlapping area within each subregion; and using said overlapping area to modify said initial area.

7. A method for determining a wireload model associated with placement of an integrated circuit, the method comprising the steps of:

inputting a plurality of circuit elements and interconnection therebetween into a computer;

defining at least one group of circuit elements and assigning a region on an integrated circuit for each one of said at least one group;

placing subgroups of said circuit elements of each of said at least one group into a location within its respective region;

estimating an area of each of said region;

determining an average wire length per fanout for each said at least one group from empirical data during a floorplanning step and prior to performing an actual place and route step;

using said determined average wire length to determine the wireload model as a function of said estimated area; and using said wire load model to design said integrated circuit.

8. The method according to claim 7 wherein said step of estimating an area of each of said region includes:

determining an initial area of each of said regions;

partitioning a subregion for each circuit element occurring within each region;

determining an overlapping area within each subregion; and using said overlapping area to modify said initial area.

9. A method for determining parasitics associated with routing of an integrated circuit, the method comprising the steps of:

inputting a plurality of circuit elements and interconnection therebetween into a computer;

defining at least one group of circuit elements and assigning a region on an integrated circuit for each one of said at least one group;

placing subgroups of said circuit elements of each of said at least one group into a location within its respective region;

estimating an area of each of said region;

determining RC time constant effects corresponding to routing of said integrated circuit, said RC time constant effects being distinguished between those that are intra regional and those that are inter regional;

providing a parasitic to include said RC time constant effects; and using said parasitic to include said RC time constant effects while in a floor planning stage and prior to performing a place and route step; and using said parasitic to design said integrated circuit.

10. The method according to claim 9 wherein said step of estimating an area of each of said region includes:

determining an initial area of each of said regions;

partitioning a subregion for each circuit element occurring within each region;

determining an overlapping area within each subregion; and using said overlapping area to modify said initial area.

11. The method according to claim 9 wherein said parasitic is a delay associated with placement and routing of said integrated circuit.

12. The method according to claim 9 wherein said step of providing a parasitic further includes the step of providing said parasitic in a simplified form for use with CAE tools.

* * * * *